United States Patent
Stoica et al.

(10) Patent No.: US 8,000,406 B2
(45) Date of Patent: Aug. 16, 2011

(54) TIMING OF ULTRA WIDEBAND PULSE GENERATOR

(75) Inventors: Lucian Stoica, Oulu (FI); Sakari Tiuraniemi, Oulu (FR); Ian Oppermann, Espoo (FI)

(73) Assignee: Oulun Yliopisto, Oulu (FI)

( * ) Notice: Subject to any disclaimer, the term of this patent is extended or adjusted under 35 U.S.C. 154(b) by 1086 days.

(21) Appl. No.: 11/596,908

(22) PCT Filed: May 18, 2005

(86) PCT No.: PCT/FI2005/050169
§ 371 (c)(1),
(2), (4) Date: May 31, 2007

(87) PCT Pub. No.: WO2005/112260
PCT Pub. Date: Nov. 24, 2005

(65) Prior Publication Data
US 2008/0049878 A1    Feb. 28, 2008

(30) Foreign Application Priority Data
May 19, 2004    (FI) ..................................... 20045181

(51) Int. Cl.
*H04L 27/00*    (2006.01)
(52) U.S. Cl. ........ 375/295; 375/260; 375/354; 375/376; 327/141; 327/156
(58) Field of Classification Search .................. 375/354, 375/376, 260, 295; 327/141, 156
See application file for complete search history.

(56) References Cited

U.S. PATENT DOCUMENTS

| 5,786,715 | A * | 7/1998 | Halepete | 327/116 |
|---|---|---|---|---|
| 6,295,328 | B1* | 9/2001 | Kim et al. | 375/376 |
| 6,480,045 | B2* | 11/2002 | Albean | 327/119 |
| 6,704,881 | B1 | 3/2004 | Li et al. | |
| 7,221,724 | B2* | 5/2007 | Schell | 375/355 |
| 2004/0047414 | A1 | 3/2004 | Helal et al. | |
| 2004/0148538 | A1 | 7/2004 | Li et al. | |
| 2004/0170218 | A1 | 9/2004 | Molisch et al. | |

FOREIGN PATENT DOCUMENTS

| WO | 02/054204 | 7/2002 |
|---|---|---|
| WO | WO 02/054204 A2 | 7/2002 |
| WO | WO 04001973 A1 * | 12/2003 |
| WO | WO 2005/112260 A1 | 11/2005 |

OTHER PUBLICATIONS

Lucian Stoica et al "A Low Complexity UWB Circuit Transceiver Architecture for Low Cost Sensor TAG Systems" IEEE Sep. 2004.*

(Continued)

*Primary Examiner* — Leon Flores
(74) *Attorney, Agent, or Firm* — Hamilton, Brook, Smith & Reynolds, P.C.

(57) ABSTRACT

A method and apparatus for producing timing signals for an ultra wideband pulse generator are provided. The apparatus comprises a frequency multiplier for generating a converted signal having a multiple of a pulse frequency of a reference clock signal inputted into the frequency multipliers. Furthermore, the apparatus comprises a feedback controlled delay circuitry connected to the frequency multipliers, for generating at least two versions of the converted signal, the at least two versions having a predefined delay with respect to each other, the two versions being used as timing signals for an ultra wideband pulse generator.

14 Claims, 4 Drawing Sheets

OTHER PUBLICATIONS

Stoica, L. et al.: "An Ultra Wideband TAG Circuit Transceiver Architecture", in Ultra Wideband Systems, 2004, Joint Conference on Ultrawideband Systems and Technologies, joint UWBST & IWUWBS, IEEE Conference Proceedings Article, pp. 258-262.

Stoica, L., et al., "An Ultra Wideband TAG Circuit Transceiver Architecture," *Ultra Wideband Systems, joint with Conference on Ultrawideband Systems and Technoligies, joint UWBST & IWUWBS, International Workshop*, Kyoto, Japan, pp. 258-262 (2004).

* cited by examiner

TIMING OF ULTRA WIDEBAND PULSE GENERATOR

RELATED APPLICATIONS

This application is the U.S. National Stage of International Application No. PCT/FI2005/050169, filed 18 May 2005, published in English, and claims priority under 35 U.S.C. §119 or 365 to Finland Application No. 20045181, filed 19 May 2004.

FIELD

The invention relates to a method of producing timing signals for an ultra wideband pulse generator using a plurality of timing signals as input, and to an apparatus for producing timing signals for an ultra wideband pulse generator using a plurality of timing signals as input.

BACKGROUND

Ultra wideband (UWB) is a promising technology for future data communications applications. UWB frequency characteristics are typically fulfilled if the fractional bandwidth $B_f$ or the −10 dB bandwidth of the signal is greater than 20% or greater than 500 MHz, respectively.

A UWB system is essentially based on a base-band signal processing system, where wideband characteristics of radio transmission are obtained by generating short pulses of a typical duration of the order of nanoseconds. Based on an applied time domain-frequency domain dualism, temporal characteristics of UWB pulses directly reflect the frequency characteristics of the transmission. Therefore, high quality requirements are set to the pulse generation mechanism in UWB systems in order to fulfil the frequency requirements of a UWB transmission.

UWB pulses are generated in a UWB pulse generator, which may use a plurality of timing signals as input. Characteristics of the timing signals play an essential role in the temporal characteristics of the UWB pulses, and therefore, it is desired to consider techniques for producing high-quality timing signals for such UWB pulse generators.

BRIEF DESCRIPTION OF THE INVENTION

An object of the invention is to provide a method and apparatus for producing high-quality timing signals for a UWB pulse generator. According to a first aspect of the invention, there is provided an apparatus for producing timing signals for an ultra wideband pulse generator using a plurality of timing signals as input, comprising: a frequency multiplier for generating a converted signal having a multiple of a pulse frequency of a reference clock signal inputted into the frequency multiplier; and a feedback controlled delay circuitry connected to the frequency multiplier, for generating at least two versions of the converted signal, the at least two versions having a predefined delay with respect to each other, the at least two versions being used as timing signals for an ultra wideband pulse generator.

According to a second aspect of the invention, there is provided a method of producing timing signals for an ultra wideband pulse generator using a plurality of timing signals as input, the method comprising: inputting a reference clock signal; and generating a converted signal from the reference clock signal, the converted signal having a multiple of a pulse frequency of the reference clock signal; generating at least two versions of the converted signal by using a feedback control, the at least two versions having a predefined delay with respect to each other; and using the at least two versions of the converted signal as timing signals for an ultra wideband pulse generator.

Preferred embodiments of the invention are described in the dependent claims.

The method and apparatus of the invention provide several advantages. In a preferred embodiment of the invention, a reference clock signal is brought into a frequency multiplier circuit, which generates a converted signal having a multiple frequency of the reference clock signal. The frequency of the converted signal corresponds to a UWB pulse frequency. The converted signal is fed into a feedback controlled delay circuitry, which generates versions of the converted signal, the versions having a predefined mutual delay. The versions of the converted signal are used as timing signals for the UWB pulse generator. A multiplication procedure in generating the UWB pulse frequency enables implementing a reference clock by using low-frequency oscillators, such as a crystal oscillator, which typically have beneficial characteristics, such as a low jitter. The use of the feedback control in generating the versions of the converted signal results in an accurate and stable relative timing of the timing signals, which timing is essential in order to obtain desired temporal characteristics of the UWB pulses and thus desired spectral characteristics of a UWB transmission.

In an embodiment of the invention, a delayed component of each version of the converted signal is generated in the feedback controlled delay circuitry, which delayed components are further used as timing signals for the UWB pulse generator. In this embodiment, an accurate and stable timing is obtained between a version of the converted signal and a corresponding delayed component, which timing improves the temporal characteristics, such as the pulse shape, of a UWB pulse.

LIST OF DRAWINGS

In the following, the invention will be described in greater detail with reference to the preferred embodiments and the accompanying drawings, in which FIG. 1 shows an example of an ultra wideband transceiver;

DESCRIPTION OF EMBODIMENTS

Figure 1:
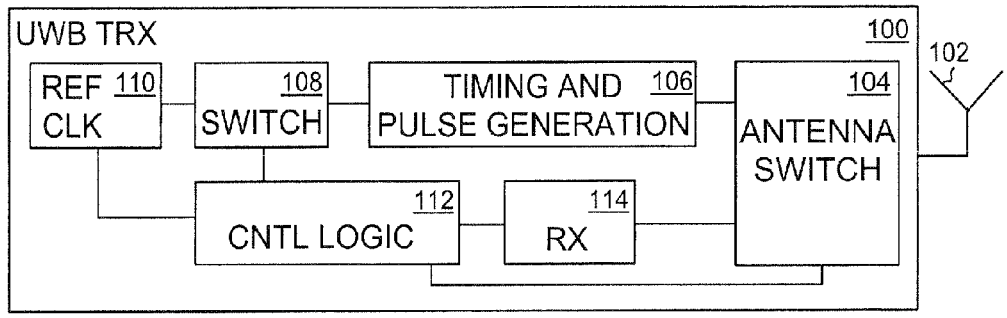

With reference to FIG. 1, an example of a structure of an ultra wideband transceiver (UWB TRX) 100 is shown.

The UWB (ultra wideband) transceiver 100 typically includes a reference clock 110 for providing clock signals for a timing and pulse generation circuit 106 and for control logic 112.

The timing and pulse generation circuit 106 generates UWB pulses, which are fed into an antenna 102 through an antenna switch unit 104. The antenna switch unit 104 typically time-multiplexes the antenna 102 between transmission and reception. The reception is carried out by a receiver unit 114, which is controlled by the control logic 112. The receiver unit 112 typically includes a low-noise amplifier and means for energy detection.

A switch unit 108 may be used between the reference clock 110 and the timing and pulse generation circuit 106. The switch unit 108 is turned on during transmission and switched off during reception. The switch unit 108 is controlled by the control logic 112. The control logic 112 may include means for base band processing, for example.

Figure 2:
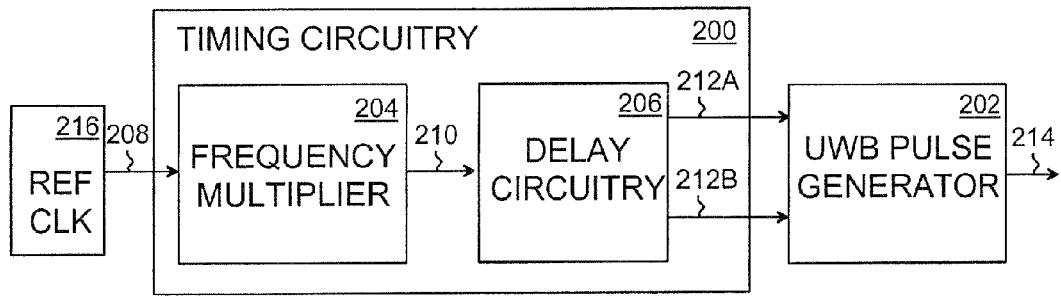
FIG. 2 shows an ultra wideband pulse generation system.

With reference to FIG. 2, an example of a UWB pulse generation system is shown. Temporal characteristics of signals in various stages of a UWB pulse generation are shown in the timing chart of FIG. 3A. A horizontal axis 300 shows time in arbitrary units, while a vertical axis 302 shows signal level in voltage units.

With further reference to FIG. 2, the pulse generation system includes a UWB pulse generator 202 and a timing circuitry 200 connected to the UWB pulse generator 202.

The timing circuitry 200 comprises a frequency multiplier 204, which receives a reference clock signal 208 from a reference clock 216 and generates a converted signal 210 from the reference clock signal 208. The reference clock signal 304 shown in FIG. 3A is characterized by a reference clock cycle 320 period ($T_{REF}$).

Figure 3A:
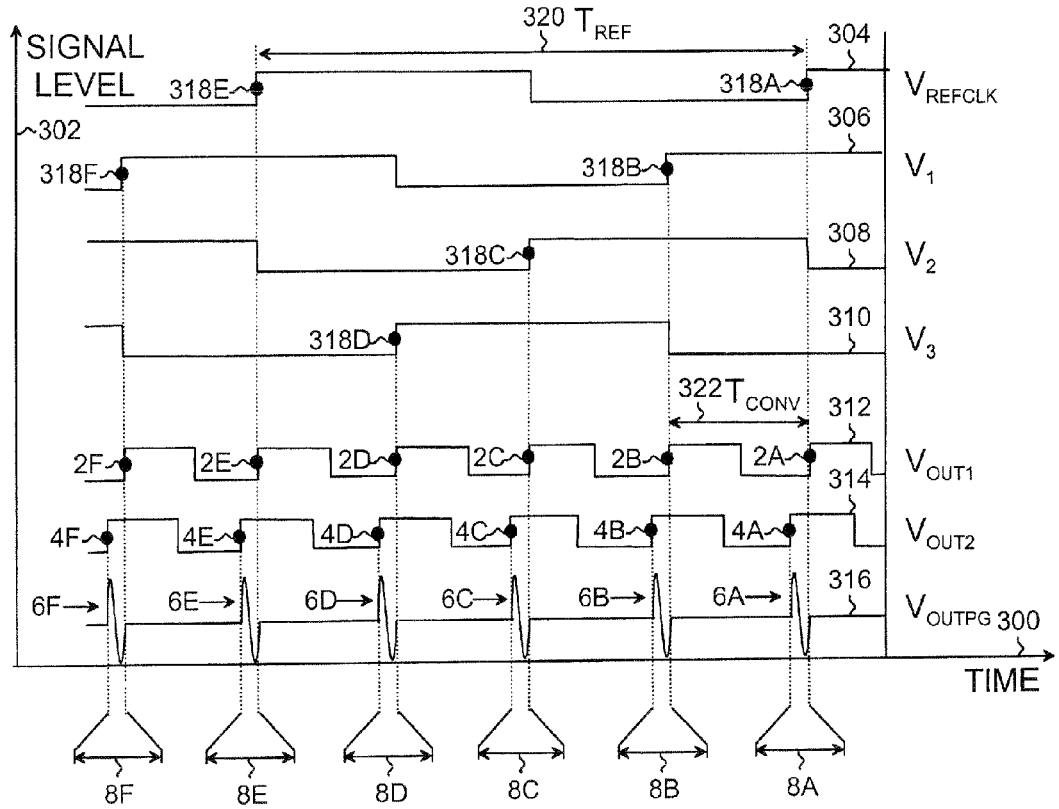
FIG. 3A shows a first example of a signal timing chart according to embodiments of the invention.
Figure 3B:
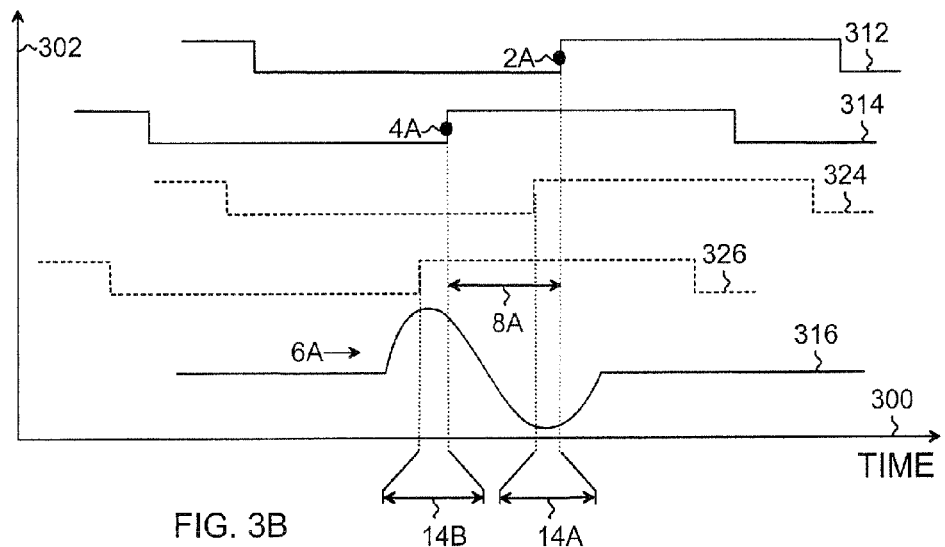
FIG. 3B shows a second example of a signal timing chart according to embodiments of the invention.

The converted signal 210 generated by the frequency multiplier 204 is represented by the converted signal 312 in FIG. 3A. The cycle period ($T_{CONV}$) 322 of the converted signal 210 is such that the pulse frequency of the converted signal 210, 312 is a multiple of a pulse frequency of the reference clock signal 208, 304, i.e.

$$\frac{1}{T_{CONV}} = N \times \frac{1}{T_{REF}},$$

where multiplication factor N is an integer. In the example shown in FIG. 3A, N equals 4. The invention is not, however, restricted to given FIG. 4, but the value of the multiplication factor N may be selected freely according to the pulse frequency of the reference clock signal 208, 304 and required pulse frequency of the converted signal 210, 312.

In an embodiment of the invention, the pulse frequency of the reference clock signal 208, 304 is less than 100 MHz, and the pulse frequency of the converted signal 210, 304 is more than 400 MHz. For example, a pulse frequency of 450 MHz of the converted signal 210, 312 may be obtained from a pulse frequency 33 MHz of the reference clock signal 208, 304 by using a multiplication factor of 15. The invention is not, however, restricted to the given frequency limits, but the frequency range may be selected freely depending on the requirements of the UWB transceiver 100.

The timing circuitry 200 further comprises a feedback controlled delay circuitry 206 connected to the frequency multiplier 204. The feedback controlled delay circuitry 206 receives the converted signal 210, 312 and generates at least two versions 212A, 212B of the converted signal 210. The at least two versions 212A, 212B have a predefined delay with respect to each other and are used as timing signals for the UWB pulse generator 202.

A feedback control of the feedback controlled delay circuitry 206 is based on, for example, the use of the delay between the two versions 212A, 212B of the converted signal 210 as feedback input and adjustment of the delay circuitry characteristics such that the delay exceeds the predefined delay value.

With reference to FIG. 3A, two versions of the converted signal 312 are represented by the original converted signal 312, herein also referred to as a first version 312, and a delayed version 314, herein referred to as a second version 314. The first version 312 and the second version 314 are also referred to as timing signals.

The delay between the first version 312 and the second version 314 may be defined as a time gap 8A to 8F between a rising edge 2A to 2F of the first version 312 and a rising edge 4A to 4F of the second version 314.

In an embodiment of the invention, the predefined delay 8A to 8F is less than 250 picoseconds. In some applications, the delay may range from 100 to 150 picoseconds. In an embodiment of the invention, the delay is 125 picoseconds. The invention is not, however, restricted to the given figures, but the predefined delay may be chosen according to the needs of a UWB transceiver 100.

The UWB pulse generator 202 receives the timing signals 212A, 312 and 212B, 314 and generates a UWB signal 214, 316, which includes a train of UWB pulses 6A to 6F. The frequency of occurrence of the UWB pulses 6A to 6F typically equals the pulse frequency of the converted signal 210, 312.

The use of a multiplication approach in generating the converted signal 210, 312 and its versions 312, 314 enables a low-frequency crystal oscillator being used as a reference clock 216. Advantages of a low-frequency crystal oscillator are, for example, a low jitter, which results in beneficial characteristics, such a low phase-noise, of the converted signal 210, 312 and its versions 212A, 212B, 312, 314.

The use of the feedback controlled delay circuitry 206 provides an accurate delay between the timing signals 212A, 212B, thus resulting in deterministic and well-defined UWB pulses 6A to 6F in the UWB pulse generator 202. The deterministic and well-defined UWB pulses 6A to 6F improve transmission signal characteristics and are beneficial in terms of spectral characteristics and reception, for example.

Figure 4:
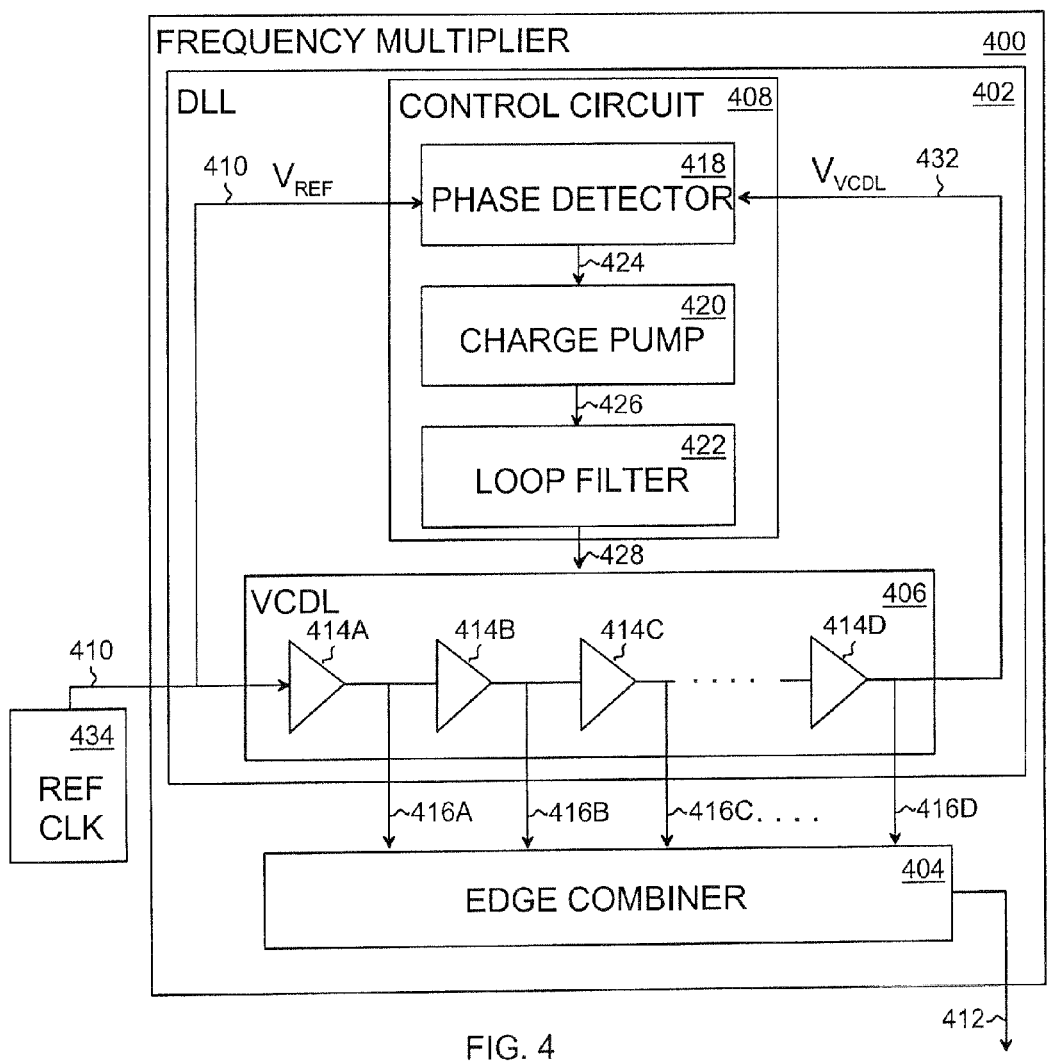
FIG. 4 shows an embodiment of a frequency multiplier.

With reference to FIG. 4, the frequency multiplier 400 may include a delay-locked loop (DLL) 402 and an edge combiner 404 connected to the delay-locked loop 402. A reference clock signal 410 generated in the reference clock 434 is inputted into the frequency multiplier 400.

The delay-locked loop 402 generates a plurality of delayed versions 416A to 416D of the reference clock signal 410. The delay-locked loop 402 typically comprises a voltage-controlled delay line (VCDL) 406 and a control circuit 408 controlling the voltage-controlled delay line 406.

The control circuit 408 is typically provided with the reference clock signal 410 and a final stage output 432 from the voltage-controlled delay line 406. A phase detector 418 comprised by the control circuit 408 generates UP/DOWN signals 424 according to the phase difference between the reference clock signal 410 and the final stage output 432.

The UP/DOWN signals 424 are inputted into a charge pump 420, which outputs charge-up/charge-down pulses 426 into a loop filter 422 according to the UP/DOWN signals 424.

The loop filter 422 attenuates high-frequency AC (alternating current) components generated by the charge-up/charge-down pulses 426, thus providing a stable control voltage 428 for the voltage-controlled delay line 406.

Delayed versions 416A to 416D of the reference clock signal 410 are typically generated by controllable delay elements 414A to 414D connected in series. The controllable delay elements 414A to 414D are typically controlled by the control voltage 428. In an embodiment of the invention, the controllable delay elements 414A to 414D are identical, thus providing a constant delay between the delayed versions 416A to 416D of the reference clock signal 410.

A delay element 414A to 414D may be implemented with two cascading CMOS (Complementary Metal-Oxide Semiconductor) inverters, for example.

With further reference to FIG. 3A, the delayed versions 306, 308, 310 of the reference clock signal 304 are shown. The first delayed version 306, the second delayed version 308 and the third delayed version 310 correspond to a delayed version 416A outputted by a first controllable delay element 414A, a delayed version 416B outputted by a second controllable delay element 414B, and a delayed version 416C outputted by a third controllable delay element 414C, respectively. For the simplicity of illustration, the delayed version 414D outputted by a final controllable delay element 414D is represented by the reference clock signal 304.

The delay-locked loop 402 is deemed to be in a locked state, when the reference clock signal 410 and the final stage output 432 are in phase. In such a case, the superposition of delays generated by the delay elements 414A to 414D typically spans one reference clock cycle 320. Furthermore, the delay of successive delayed versions 416A to 416D and 304 to 310 equals the cycle period 322 of the converted signal 312. The control circuit 408 is aimed at searching and maintaining the locked state.

The delayed versions 416A to 416D of the reference clock signal 410 are fed into the edge combiner 404, which detects edges 318A to 318F, such as rising edges, of the delayed versions 416A to 416D and 304 to 310 of the reference clock signal 304, 410, and generates the converted signal 312 having edges 2A to 2F at time instants of the edges 318A to 318F of the delayed versions 304 to 310 of the reference clock signal 310. A structure of an edge combiner 404 is known to a one skilled in the art and will not be described with a great detail in this context.

Figure 5:
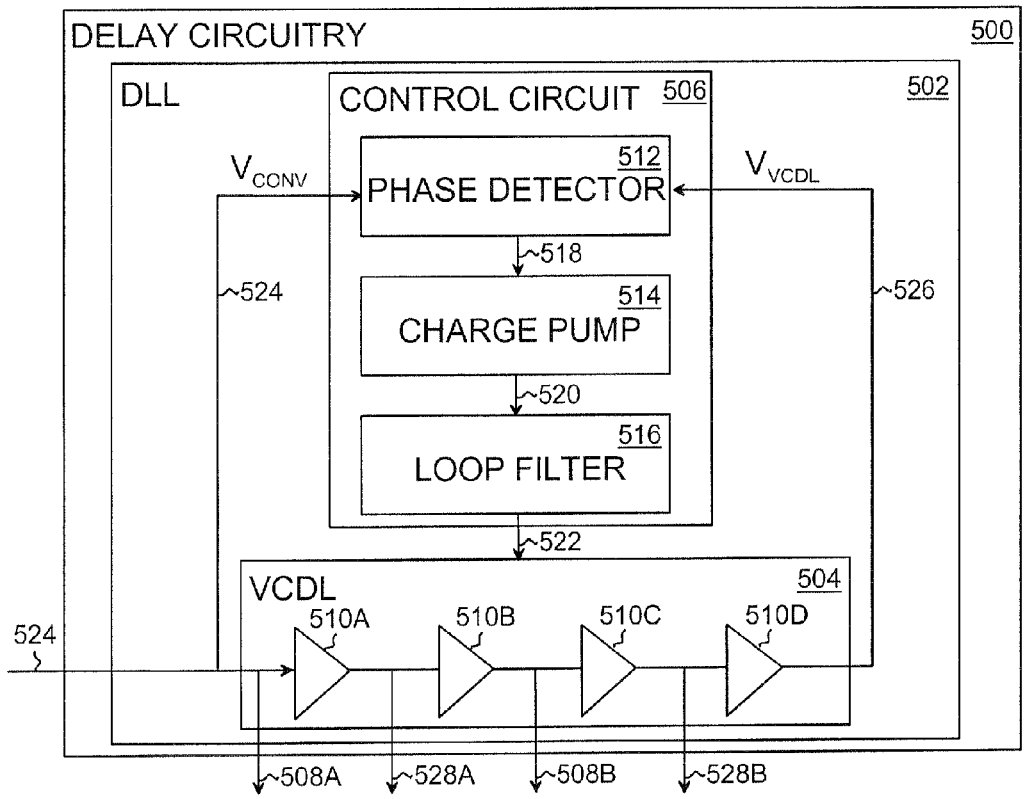
FIG. 5 shows an example of embodiments of a feedback controlled delay circuitry.

With reference to FIG. 5, the feedback controlled delay circuitry 500 may include a secondary delay locked loop 502, which includes a secondary voltage-controlled delay line 504 and a secondary control circuit 506.

The converted signal 524 corresponding to the converted signal 312 shown in FIG. 3A may be fed into the secondary voltage-controlled delay line 504 and the secondary control circuit 506.

The secondary voltage-controlled delay line 504 may be constructed from controllable delay elements 510A to 510D, each of which delaying an input signal by half of the delay 8A to 8F required between the versions 312 and 314 of the converted signal 312. In the example of FIG. 5, a first version 508A of the converted signal 524 is taken from the input of a first controllable delay element 510A and the second version 508B is taken between a second controllable delay element 510B and a third delay element 510C. As a result, a total of one unit of delay is obtained between the first version and 508A and the second version 508B of the converted signal 524.

The secondary control circuit 506 comprises a secondary phase detector 512, which uses the converted signal 524 and a secondary final stage signal 526 as input. The secondary phase detector 512 detects the relative phase of the converted signal 524 and the secondary final stage signal 526, and feeds a signal waveform 518 into a secondary charge pump 514 accordingly. The charge pump 514 injects charge-up/charge-down pulses 520 into a secondary loop filter 516 according to the signal waveform 518. The loop filter 516 generates a control voltage 522 for controlling the secondary voltage controlled delay line 504.

In an embodiment of the invention, a delayed component 528A, 528B for each version 508A, 508B of the converted signal 524 is generated by the delay circuitry 500. The delayed components 528A, 528B are outputted and used as timing signals for the UWB pulse generator 202. In the example of FIG. 5, the first version 508A is associated with a first delayed component 528A and the second version 508B is associated with a second delayed component 528B.

With reference to FIG. 3A, a first delayed component 324 of the first version 312 of the converted signal 312, and a second delayed component 326 of the second version 314 of the converted signal 312 are shown.

A first delay 14A between the first delayed component 324 and the first version 312 is 14A. A second delay 14B between the second delayed component 326 and the second version 314 is 14B. In an embodiment of the invention, the first delay 14A and the second delay 14B are identical.

In an embodiment of the invention, the delay 14A, 14B is less than 250 picoseconds. In some applications, the delay 14A, 14b may range from 100 to 150 picoseconds.

The secondary delay-locked loop 502 enables a feedback mechanism and replication of the converted signal 524 being used in the generation of the delayed components 528A, 528B, thus resulting in an accurate and stable relative timing of the versions 508A, 508B and their associated delayed components 528A, 528B.

Figure 6:
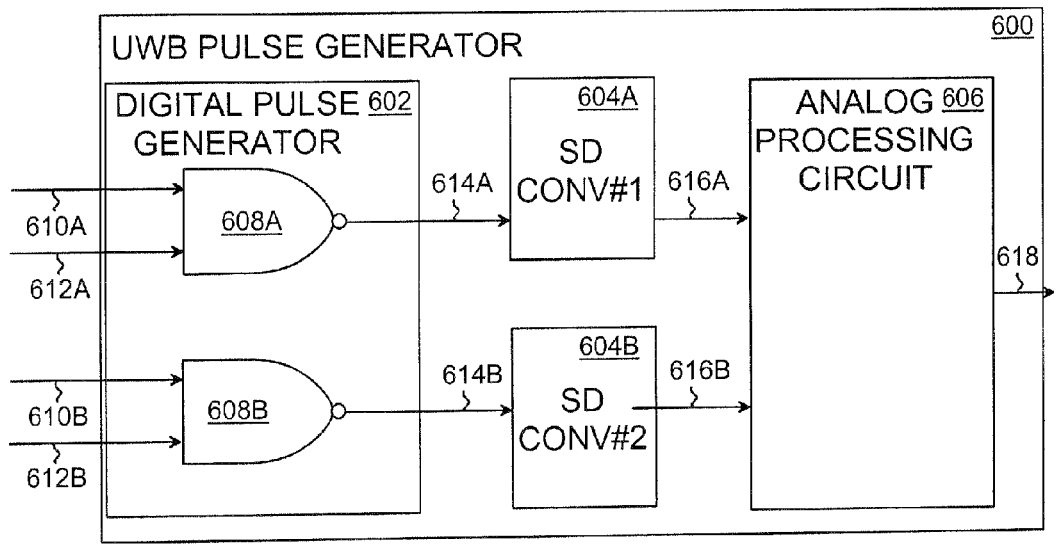
FIG. 6 shows an example of embodiments of an ultra wideband pulse generator.

With reference to FIG. 6, an example of a structure of a UWB pulse generator 600 is shown. The UWB pulse generator 600 may include a digital pulse generator 602, single-ended-to-differential converters (SD CONV#1, SD CONV#2) 604A, 604B connected to the digital pulse generator 602, and an analog processing circuit 606 connected to the single-ended-to differential-converters 604A, 604B.

The digital pulse generator 602 may include logical elements 608A, 608B, such as NAND-gates, each of which logical element 608A, 608B is provided with a version 610A, 610B of the converted signal 524. A delayed component 612A, 612B of each version 610A, 610B may further be inputted into the logical element 608A, 608B.

For example, the first version 610A of the converted signal 524 and the delayed component 612A of the first version 610A are fed into a first NAND-gate 608A. Correspondingly, the second version 610B of the converted signal 524 and the delayed component 612B of the second version are fed into a second NAND-gate 608B.

A logical element 608A, 608 generates single-ended pulses 614A, 614B, such as pulses of the Gaussian shape. A pulse width of a single-ended pulses 614A, 614B is typically proportional to an overlap between the version 610A, 610B and its delayed component 612A, 612B, and thereby the pulse width may be controlled by the delay provided by the controllable delay elements 510A, 510B.

The logical elements 608A, 608B output the single-ended pulses 614A, 614B to the single-ended-to differential-converters 604A, 604B, which transform the single-ended pulses 614A, 614B into differential pulses 616A, 616B. The differential pulses 616A, 616B are fed into the analog processing circuit 606, which generates the UWB pulses 618 on the basis, for example, subtraction of the differential pulses 616A, 616B.

If the delayed components 612A, 612B are not provided by the delay circuitry 500, the UWB pulse generator 600 may include delay elements, which delay the versions 610A, 610B of the converted signal 524, and thus produce the delayed components 612A, 612B. In such a case, the timing characteristics of the delayed components 612A, 612B may not be as beneficial as they would be if the delayed components 612A, 612B were produced in the feedback controlled delay circuitry 500.

The implementation and detailed structure of a UWB pulse generator that uses a plurality of timing signals is known to one skilled in the art. The UBW pulse generator 600 may be implemented by using CMOS circuits, for example.

The timing circuitry 200 may be implemented by an ASIC (Application Specific Integrated Circuit). Applications may exist where parts of the timing circuitry 200 are implemented by an FPGA (Field Programmable Gate Array) technology. The structure and control of the controllable delay elements and control circuits in the frequency multiplier 400 and the delay circuitry 500 are known technology to one skilled in the art.

Figure 7:
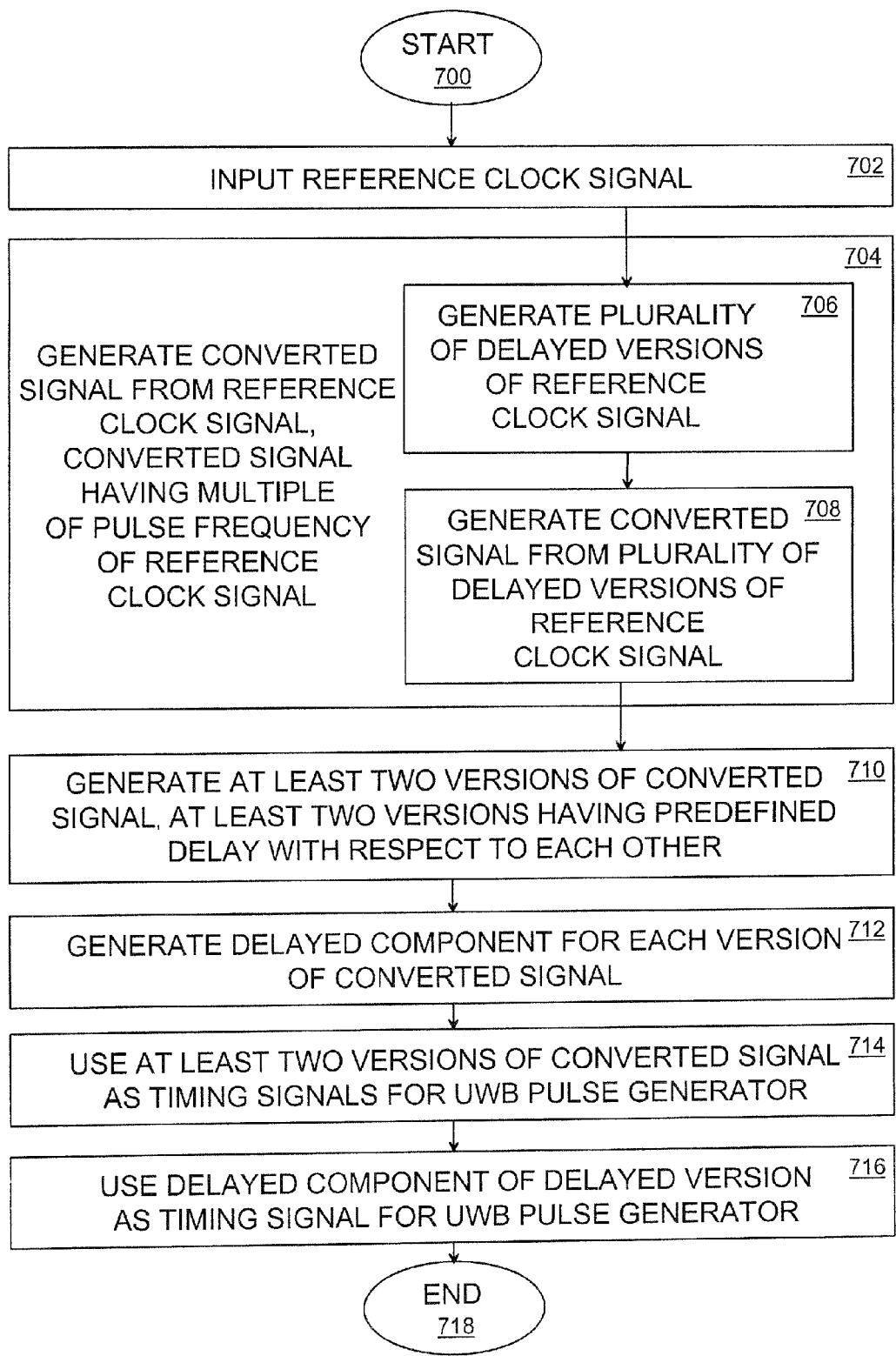
FIG. 7 illustrates a methodology according to embodiments of the invention.

With reference to FIG. 7, a methodology according to embodiments of the invention is illustrated.

In 700, the method is started.

In 702, a reference clock signal 208 is inputted. In an embodiment, the pulse frequency of the reference clock signal 208 is less than 100 megahertz.

In 704, a converted signal 210 is generated from the reference clock signal 208, the converted signal 210 having a multiple of a pulse frequency of the reference clock signal 208.

In an embodiment of the invention, a plurality of delayed versions 416A to 416D of the reference clock signal 410 is generated in 706, and the converted signal 412 is generated from the plurality of the delayed versions 416A to 416D of the reference clock signal 410 in 708.

In an embodiment of the invention, the pulse frequency of the converted signal 410 is more than 400 megahertz.

In 710, at least two versions of the converted signal 212A, 212B, 508A, 508B are generated by using a feedback control, the at least two versions 212A, 212B having a predefined delay with respect to each other.

In an embodiment of the invention, the at least two versions 212A, 212B of the converted signal 210 are generated by using a delay-locked loop 502.

In an embodiment of the invention, the two versions 212A, 212B of the converted signal have the predefined delay of less than 250 picoseconds with respect to each other.

In 712, a delayed component 528A, 528B for each version 508A, 508B of the converted signal 524 is generated.

In 714, the two versions 212A, 212B of the converted signal 210 are used as timing signals for an ultra wideband pulse generator 202.

In 716, the delayed component 528A, 528B is used as a timing signal for the ultra wideband pulse generator 202.

In 718, the method ends.

Even though the invention has been described above with reference to an example according to the accompanying drawings, it is clear that the invention is not restricted thereto but it can be modified in several ways within the scope of the appended claims.

The invention claimed is:

1. An apparatus for producing timing signals for an ultra wideband pulse generator using a plurality of timing signals as input, comprising: a frequency multiplier for generating a converted signal having a multiple of a pulse frequency of a reference clock signal inputted into the frequency multiplier, wherein the frequency multiplier comprises a first delay-locked loop for generating a plurality delayed versions of the reference clock signal, wherein the apparatus further comprises a feedback controlled delay circuitry comprising a second delay-locked loop connected to the frequency multiplier, for generating at least two versions of the converted signal, the at least two versions having a predefined delay with respect to each other, the at least two versions being used as timing signals for the ultra wideband pulse generator.

2. The apparatus of claim 1, wherein the frequency multiplier further comprises: an edge combiner connected to the first delay-locked loop, for generating the converted signal from the plurality of the delayed versions of the reference clock signal.

3. The apparatus of claim 1, wherein the pulse frequency of the reference clock signal is less than 100 megahertz; and
the frequency multiplier is configured to generate a converted signal having a pulse frequency of more than 400 MHz.

4. The apparatus of claim 1, wherein the feedback controlled delay circuitry is configured to generate the at least two versions of the converted signal, the two versions having a predefined delay of less than 250 picoseconds with respect to each other.

5. The apparatus of claim 1, wherein the feedback controlled delay circuitry is configured to generate a delayed component for each version of the converted signal, the delayed component being used as a timing signal for the ultra wideband pulse generator.

6. The apparatus of claim 1, wherein the reference clock signal is a crystal oscillator clock signal.

7. The apparatus of claim 1, wherein the predefined delay between the at least two versions of the converted signal defines a pulse width of an ultra wideband pulse.

8. A method of producing timing signals for an ultra wideband pulse generator using a plurality of timing signals as input, the method comprising: inputting a reference clock signal; generating, using a first delay-locked loop, a plurality of delayed versions of the reference clock signal; generating a converted signal from the reference clock signal, the converted signal having a multiple of a pulse frequency of the reference clock signal, including generating at least two versions of the converted signal by using a feedback control comprising a second delay-locked loop, the at least two versions having a predefined delay with respect to each other; and using the at least two versions of the converted signal as timing signals for the ultra wideband pulse generator.

9. The method of claim 8, further comprising: generating the converted signal from the plurality of the delayed versions of the reference clock signal.

10. The method of claim 8, further comprising inputting the reference clock signal having a pulse frequency less than 100 megahertz; and
generating a converted signal having a pulse frequency of more than 400 MHz.

11. The method of claim 8, further comprising generating the at least two versions of the converted signal, the two versions having a predefined delay of less than 250 picoseconds with respect to each other.

12. The method of claim 8, further comprising generating a delayed component for each version of the converted signal; and
using the delayed component as a timing signal for the ultra wideband pulse generator.

13. The method of claim 8, further comprising inputting a crystal oscillator clock signal as the reference clock signal.

14. The method of claim 8, further comprising controlling a pulse width of an ultra wideband pulse by affecting the predefined delay between the at least two versions of the converted signal.

* * * * *